(12) United States Patent
Dachtera et al.

(10) Patent No.: US 6,992,917 B2
(45) Date of Patent: Jan. 31, 2006

(54) INTEGRATED CIRCUIT WITH REDUCED BODY EFFECT SENSITIVITY

(75) Inventors: William R. Dachtera, Poughkeepsie, NY (US); Louis L. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 10/736,414

(22) Filed: Dec. 15, 2003

(65) Prior Publication Data

US 2005/0127937 A1  Jun. 16, 2005

(51) Int. Cl.
G11C 11/00 (2006.01)
G11C 7/00 (2006.01)
(52) U.S. Cl. .................. 365/154; 365/189.08; 365/201
(58) Field of Classification Search ................ 365/154, 365/156, 189.05, 189.08, 189.12, 201
See application file for complete search history.

(56) References Cited

U.S. PATENT DOCUMENTS

| | | | |
|---|---|---|---|
| 4,943,960 A | 7/1990 | Komatsu et al. | |
| 5,604,707 A | 2/1997 | Kuge et al. | |
| 5,646,900 A | 7/1997 | Tsukude et al. | |
| 5,654,913 A | 8/1997 | Fukushima et al. | |
| 6,078,058 A | 6/2000 | Hsu et al. | |
| 6,549,450 B1 * | 4/2003 | Hsu et al. | 365/154 |
| 6,608,785 B2 * | 8/2003 | Chuang et al. | 365/201 |
| 6,856,545 B2 * | 2/2005 | Ogura et al. | 365/201 |

* cited by examiner

Primary Examiner—Trong Phan
(74) Attorney, Agent, or Firm—Law Offices of Charles W. Peterson, Jr.; Louis J. Percello, Esq.; Satheesh K. Karra, Esq.

(57) ABSTRACT

An integrated circuit (IC), random access memory on an IC and method of neutralizing device floating body effects. A floating body effect monitor monitors circuit/array activity and selectively provides an indication of floating body effect manifestation from inactivity, including the lapse of time since the most recent activity or memory access. A pulse generator generates a neutralization pulse in response to an indication of inactivity. A neutralization pulse distribution circuit passes the neutralization pulse to blocks in the circuit path or to array cells.

26 Claims, 6 Drawing Sheets

INTEGRATED CIRCUIT WITH REDUCED BODY EFFECT SENSITIVITY

BACKGROUND OF THE INVENTION

1. Field of the Invention

The present invention is related to a high performance integrated circuits (ICs) and more particularly to reducing body effects in high performance ICs.

2. Background Description

Bulk silicon field effect transistors (FETs) are formed on the surface of a silicon chip or wafer. In the insulated gate FET technology typically referred to as CMOS, the silicon wafer or substrate may be of one conduction type, e.g., P-type, and areas or wells of a second conduction type, e.g., N-type, are formed in the P-type wafer. N-type FETs (NFETs) are formed on the surface of the P-type wafer and P-type FETs (PFETs) are formed on the surface of the N-wells. A first bias voltage, typically zero volts (0.0V) or ground (GND), is applied to the substrate to bias the NFETs and a second bias voltage, typically the supply voltage ($V_{hi}$), is applied to the N-wells. The substrate and N-well bias voltages help to stabilize respective FET electrical characteristics, including improving threshold voltage ($V_T$) and device current stability. Changing a device bias changes device characteristics, increasing/decreasing device $V_T$ and decreasing/increasing device operating current, depending upon the magnitude and direction of the respective change. Performance improvements for these prior art bulk transistor technologies has been achieved, normally, by reducing feature size or "scaling."

Transistor and circuit performance improvements have also come from the movement to silicon on insulator (SOI) where separate FETs are formed in a surface silicon layer. However, typically, SOI FETs are unbiased and so, suffer from what are known as body effects and history effects.

FIG. 1 shows a cross section of a prior art SOI wafer through a single FET 52 that may be an NFET or a PFET. The FET 52 is formed in a thin silicon surface layer 54 that is isolated from an underlying silicon substrate 56 by a buried oxide (BOX) layer 58. In a typically complex series of mask steps, SOI islands 60 are formed by etching shallow trenches through the surface layer 54 and filling the shallow trenches with oxide 50 to isolate islands (e.g., 60) from each other. This type of isolation is normally referred to as Shallow trench isolation (STI). STI is used to isolate circuits formed on the islands from each other and, also, isolate the FETs forming the circuits from each other. A gate oxide layer 62 is formed on the surface of the silicon islands 60. Gates 64 are patterned and formed at the device locations. Source/drain regions 66 are defined using standard implant and diffusion steps, e.g., after forming lightly doped diffusion regions (not shown) or with source drain extensions (not shown) at the gate boundaries, if desired. With each device 52, whether NFET or PFET, the source/drain regions 66 in the silicon body form an inherent lateral bipolar transistor, i.e., PNP or NPN, respectively. Once the source drain regions are formed, metal contacts (not shown) are selectively formed at source/drain regions 66 for wiring circuits together and to each other.

Ideally, the thin silicon surface layer 54 is no thicker than what is necessary to form a channel 68 between a pair of source/drain diffusions 66. In practice however, the silicon surface layer 54 is thicker than the depth of the FET's channel layer 68 and, as shown in this example, thicker than device source/drain diffusions 66. Charge trapped in the uninverted layer 70 beneath channel layer 68 of an on FET can act to lower FET threshold, causing device leakage when the device is turned off, e.g., subthreshold leakage. Further, lowering a device's threshold changes the device's operating characteristics, e.g., making it harder to turn the device off. Charge may accumulate, for example, in an on device located between two off devices, e.g., NFETs in a three way NAND gate. A logic gate with devices that have unintentionally lowered thresholds from trapped charge may sporadically operate faster than normal, i.e., when no charge is trapped. Thus, a particular path may manifest sporadic race conditions from that trapped charge. What is known as partially depleted SOI (PD-SOI) has provided one solution to charge trapping. PD-SOI devices have both lower device junction capacitance and exhibit significantly less dynamic threshold sensitivity to elevated body potential.

However, even for a PD-SOI device, when the device is off for any length of time with both source and drain at the same potential, and especially, when the device is hard off (e.g., for an NFET, when $V_{gs}=V_{gd}=-V_{dd}$), the device body tends to discharge until device junctions are slightly forward biased at turn on. (At no bias, the device body reaches steady state at the junction barrier voltage potential.) With the device body discharged, device junction capacitances are maximum. So, when the source of the device is pulled low, sharply, the off device acts as a capacitive voltage divider. Initially, $V_{hi}$ is divided essentially between the 2 approximately equal junction capacitances, i.e., the device source and drain junction. (Gate capacitances are minimal for an off device and so, may be ignored.) Thus, the voltage that develops across the source junction forward biases that junction until the capacitances charge/discharge sufficiently, which normally occurs through the inherent bipolar transistor. This is described in detain by P. F. Lu et al., "Floating Body Effects in Partially-depleted SOI CMOS Circuits," *IEEE J. Solid State Circuits*, vol. 32, pp. 1241–1253, August, 1997. The source capacitance discharge current (i.e., bipolar base current) is amplified such that the current supplied by the inherent bipolar transistor tends to counteract and slow whatever is pulling the source low.

In any circuit, the degree of resulting leakage current from forward biasing device source junctions depends on a number of factors, including, the gain of the inherent bipolar device, device threshold voltages, each device's source junction capacitance, the off or stress voltage level (i.e., $V_{dd}$) and, the number of off devices connected together. As result, logic switching speeds may depend on device history, with a steady state off device slowing a particular logic stage as much as 20–30% in one cycle over another, i.e., where the same device is only in an off state, transitionally. A pass gate multiplexor (Mux), for example, with several parallel such off devices may be especially sensitive to this floating body effect bipolar switching current and, therefore, may suffer random slow propagation delays. Multi stage latches or registers, e.g., pipeline registers, with pass gate coupling between stages may sit in the same state for several cycles with a high at both sides of the pass gates. Where clock gating techniques are used to power down/pause chip sections may well allow body effects to manifest in the registers, slowing reactivation. Memory arrays and static random access memories (SRAMs) in particular may have occasional long accesses from the floating body effects, when a number of cells in the same column or bit line are set the same. Under some floating body conditions, the bipolar current from other cells sharing the same bit lines as half selected SRAM cells (i.e., cells on a selected word line but in unselected columns) may inadvertently switch the half selected cells.

Consequently, these floating body effects pose serious design problems for densely packed SOI circuits such as for example, memory arrays. Intermittent problems may arise, such as an occasional critical path failure, spuriously reading the wrong data or, random cell failures. These types of intermittent problems are notoriously difficult to identify and diagnose. So, floating body effects cause device and circuit non-uniformities that result in difficult to identify sporadic chip failures, sometimes characterized as "soft failures."

Thus, there is a need to reduce circuit sensitivity to floating body effects.

SUMMARY OF THE INVENTION

It is a purpose of the invention to reduce integrated circuit (IC) sensitivity to floating body effects;

It is another purpose of the invention to reduce body effect charge accumulation in ICs;

It is yet another purpose of the invention to reduce critical path sensitivity to floating body effects;

It is yet another purpose of the invention to reduce memory array sensitivity to floating body effects.

The present invention relates to an integrated circuit (IC), random access memory on an IC and method of neutralizing device floating body effects. A floating body effect monitor circuit/array activity and selectively provides an indication of floating body effect manifestation from inactivity, including the lapse of time since the most recent activity or memory access. A pulse generator generates a neutralization pulse in response to an indication of inactivity. A neutralization pulse distribution circuit passes the neutralization pulse to blocks in the circuit path or to array cells.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
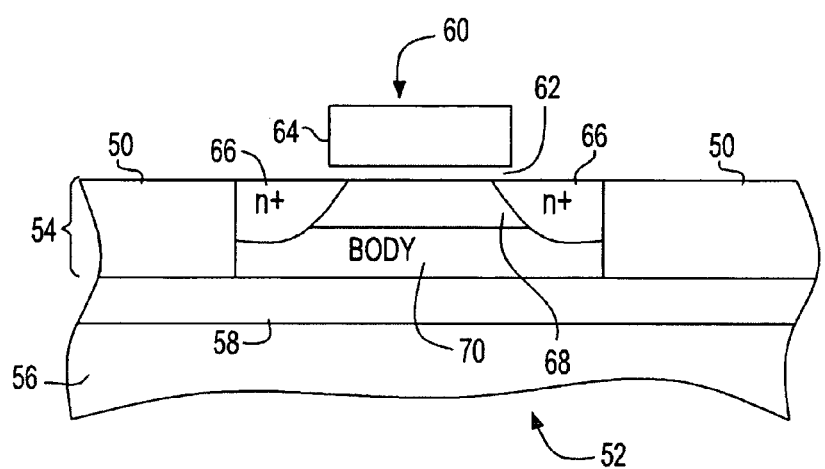
FIG. 1 shows a cross section of a prior art SOI wafer through a single FET.
Figure 2A:
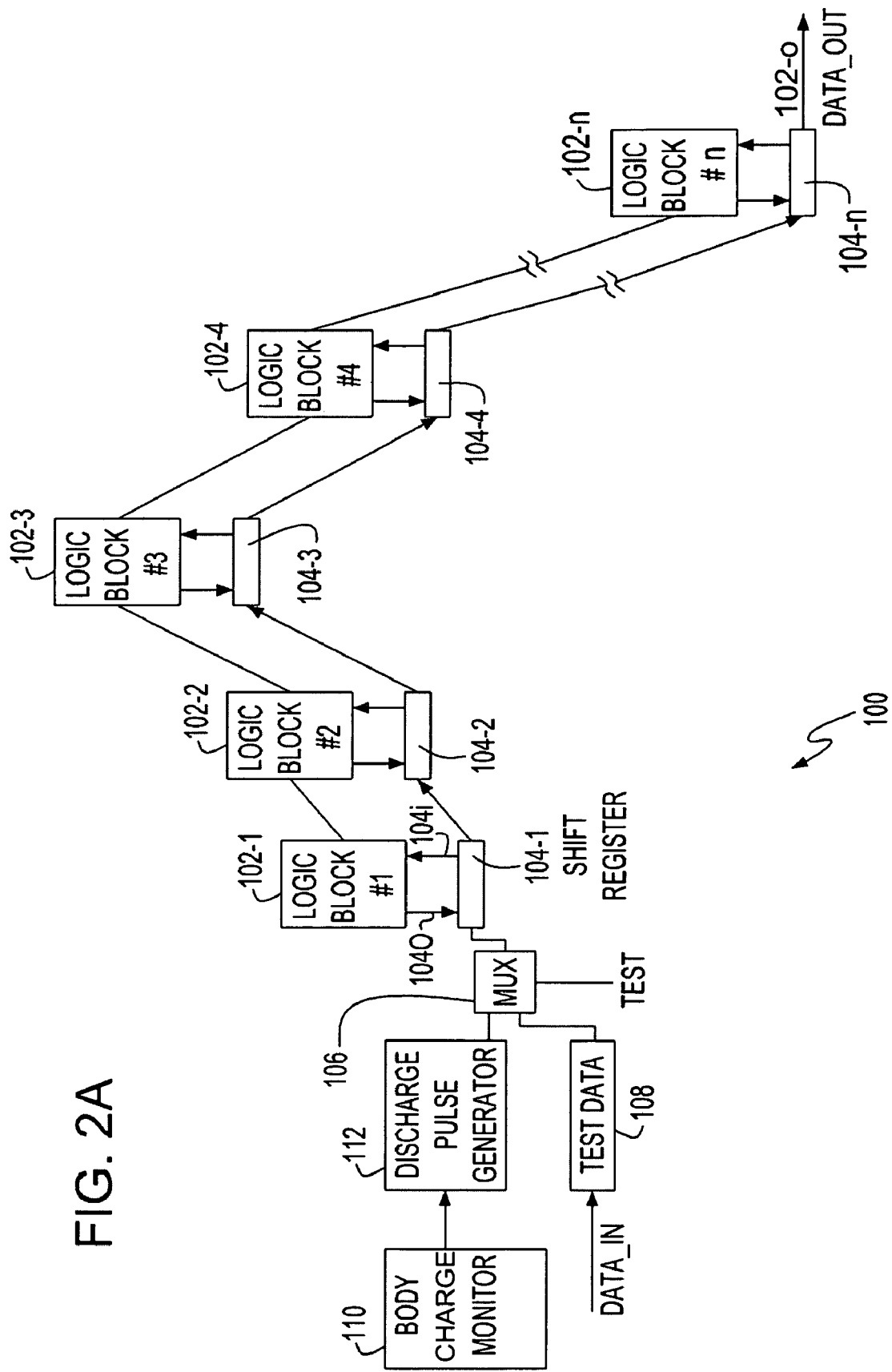
FIG. 2A shows an example of a signal path with body effect compensation according to a preferred embodiment of the present invention.

Turning now to the drawings and, more particularly, FIG. 2A shows an example of a signal path 100 with body effect compensation according to a preferred embodiment of the present invention. The signal path 100 includes a number of combinational logic blocks 102-1, 102-2, 102-3, 102-4, ..., 102-n. Each logic block 102-1, 102-2, 102-3 102-4, ..., 102-n is coupled to a corresponding shift register stage 104-1, 104-2, 104-3, 104-4, ..., 104-n, that may each be part of a test register for the particular logic path. A multiplexor (MUX) 106 provides a scan in to the first shift register stage 104-1. A test circuit 108 responsive to a test signal, e.g., for built in self test (BIST), provides a test data input for the multiplexor 106. Thus, in this example, each shift register stage 104-1, 104-2, 104-3, 104-4, ..., 104-n is shown with an input 104I and an output 104O to its corresponding logic block 102-1, 102-2, 102-3, 102-4, ..., 102-n. The other input to the multiplexor 106 is a body effect neutralization or discharge pulse generated by a body charge monitor circuit 110 and a discharge pulse generator 112.

Body charge monitor 110 may be any suitable charge monitor circuit, such as described in U.S. Pat. No. 6,078,058, entitled "SOI Floating Body Charge Monitor Circuit and Method" to Hsu et al., assigned to the assignee of the present invention and incorporated herein by reference. Discharge Pulse generator 112 may be any suitable state of the art pulse generator circuit. Logic blocks 102-1, 102-2, 102-3, 102-4, ..., 102-n, generically represent any suitable logic gate, circuit, macro, etc., providing an appropriate logic function for a particular application and, where n is determined by the sum of the nominal block delays and the clock period for the path. Shift register stages 104-1, 104-2, 104-3, 104-4, ..., 104-n, may be any suitable latch or register stage. In particular, shift register stages 104-1, 104-2, 104-3, 104-4, ..., 104-n, may be part of a test scan register string as shown and, each may be a typical level sensitive scan design (LSSD) latch with appropriate modification.

Figure 2B:
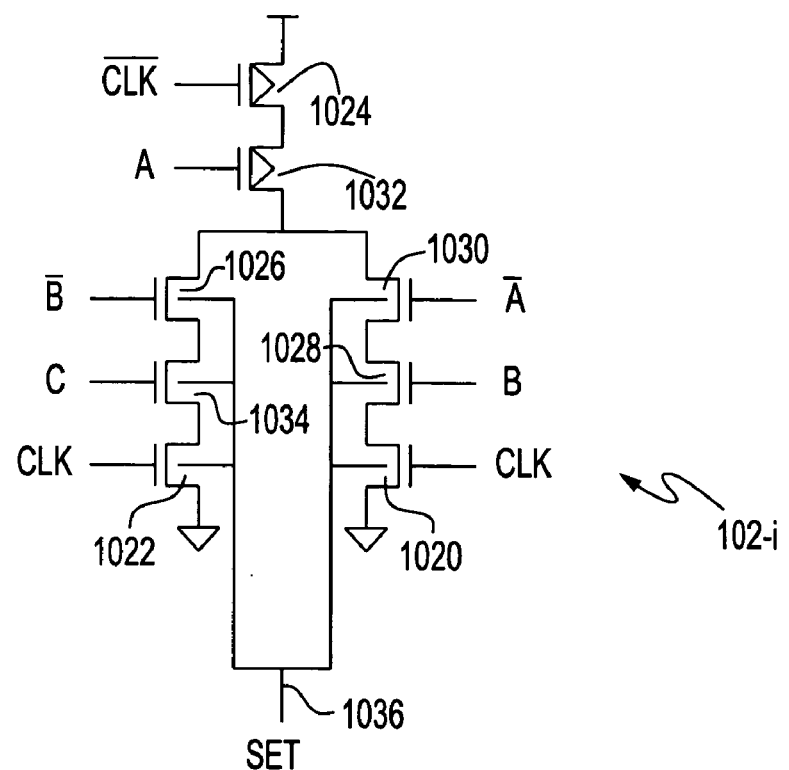
FIG. 2B shows an example of a clocked CMOS logic gate providing a clocked AND-OR-invert logic function and modified to allow for floating body effect charge discharge or neutralization.

Further, as shown for the example of FIG. 2B, logic blocks 102-1, 102-2, 102-3, 102-4, ..., 102-i, ..., 102-n, may be specifically modified to allow for floating body effect charge discharge or neutralization. So, in this example, a clocked CMOS logic gate 102-i is shown providing a clocked AND-OR-invert logic function. A complementary clock pair CLK and $\overline{\text{CLR}}$ is provided with the true at the gates of NFETs 1020 and 1022 and the complement to the gate of PFET 1024. A first complementary logic signal pair B and $\overline{\text{B}}$ is provided to the gates of NFETs 1026 and 1028. A second complementary logic signal pair A and $\overline{\text{A}}$ is provided to the gates of NFET 1030 and PFET 1032. A third logic signal C is provided to the gate of NFET 1034. A set signal is provided at set input 1036 to the bodies of NFETs 1022, 1024, 1026, 1028, 1030 and 1034. For this example, whenever the body charge monitor 110 determines that gate 102-i has been dormant (i.e., the clock at the gates of NFETs 1026 and 1028 has remained low and the clock complement at the gate of PFET 1024 has remained high) for sufficient time that body charges have reached steady state and may affect gate 102-i performance; a set signal is provided at set input 1036 to discharge the bodies of NFETs 1022, 1024, 1026, 1028, 1030 and 1034 before the clock arrives. It should be noted that clocked CMOS logic gate 102-i is shown as a representative example of application of the present invention to any logic gate and not intended as a limitation. Body discharging as applied to clocked CMOS logic gate 102-i, may likewise be applied to any logic gate. It should further be noted that the set signal applied to set input 1036 is not necessarily a voltage associated with a logic one for the particular technology, but instead is a signal sufficient to discharge any body charge for connected FETs.

Figure 2C:
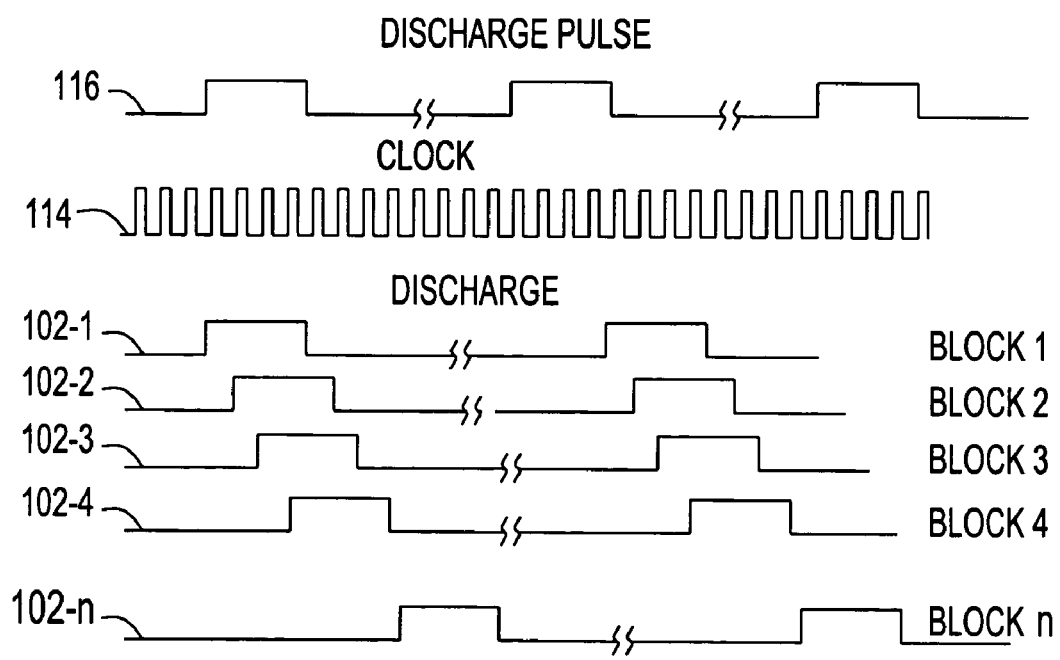
FIG. 2C is an example of a timing diagram of neutralization timing for the signal path of FIG. 2A.

FIG. 2C is an example of a timing diagram of discharge or neutralization timing for the signal path 100 of FIG. 2A. Each of shift register stages 104-1, 104-2, 104-3, 104-4, ..., 104-n, body charge monitor 110 and discharge pulse generator 112 are clocked by a common clock 114. Whenever the data path is idled for a sufficient period of time for logic blocks 102-1, 102-2, 102-3, 102-4, ..., 102-n to have been affected by body effects, body charge monitor circuit 110 will provide an indication to that effect. In response, the discharge pulse generator 112 will generate a neutralization pulse 116. The neutralization pulse 116 out of the discharge pulse generator 112 passes through multiplexor 106 to the first register stage 104-1 and begins to propagate through the shift register stages 104-1, 104-2, 104-3, 104-4, ..., 104-n. With each succeeding clock cycle, the neutralization pulse passes to a corresponding one of the shift register stages 104-1, 104-2, 104-3, 104-4, ..., 104-n. As the pulse passes through each shift register stages 104-1, 104-2, 104-3, 104-4, ..., 104-n, it forces each corresponding logic block 102-1, 102-2, 102-3, 102-4, ..., 102-n into a neutralization mode. The neutralization pulse width may be several clock cycles long and is long enough to sufficiently discharge (i.e., neutralize) the path logic blocks 102-1, 102-2, 102-3, 102-4, ..., 102-n. Further, during each neutralization pulse and at each time the path is activated, the body charge monitor 110 is reset and, begins monitoring again at the end of the pulse or the activity. In neutralization mode each logic block 102-1, 102-2, 102-3, 102-4, ..., 102-n briefly switches device bias conditions on any devices that may be experiencing body effects, thereby, normalizing any such device to minimize body effects. Thus, subsequently, when a logic signal normally propagates through logic path 100, the path delay is closer to normal, rather than faster or slower than normal.

Figure 3A:
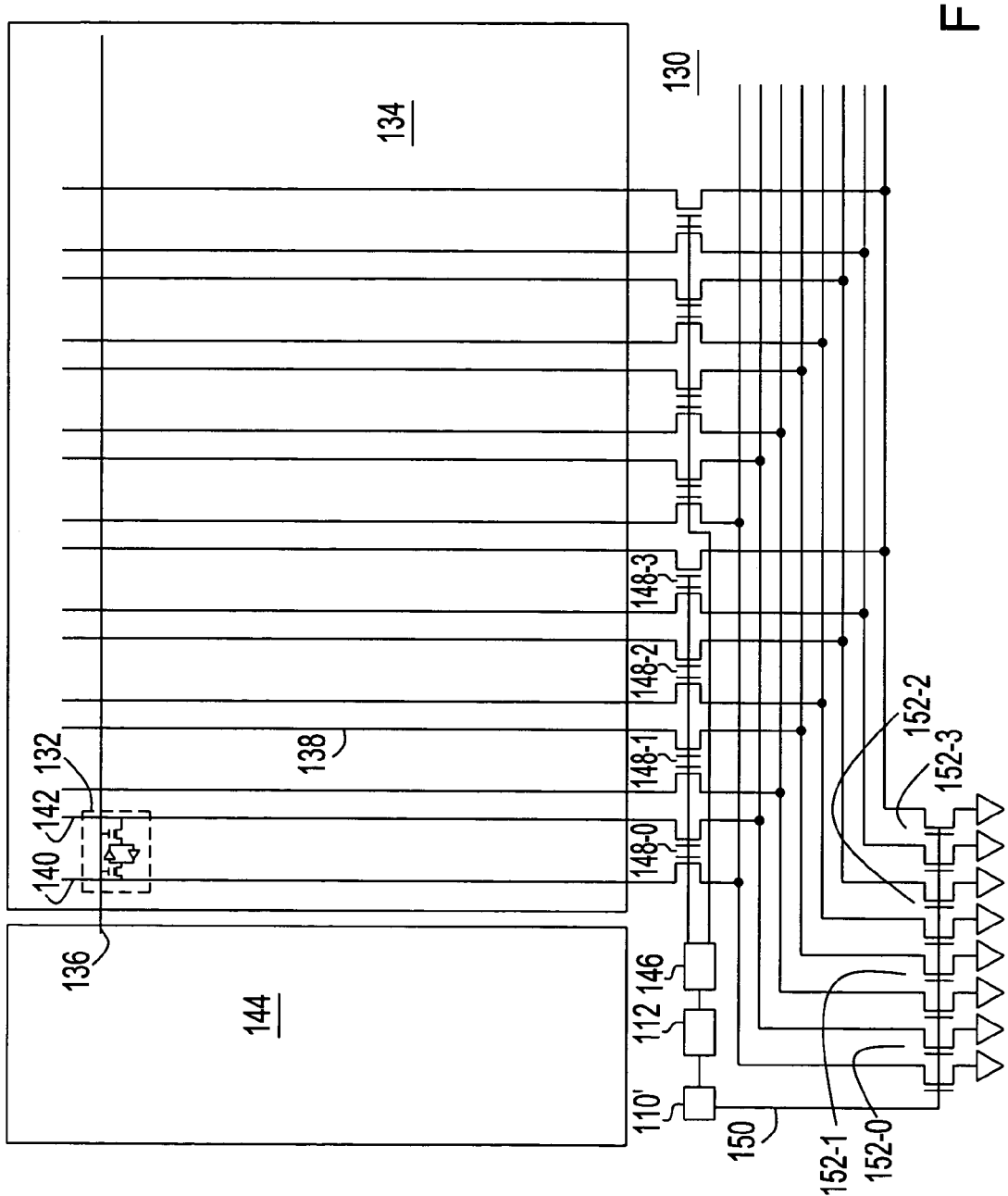
FIG. 3A shows an example of a random access memory (RAM) with body effect compensation according to a preferred embodiment of the present invention.
Figure 3B:
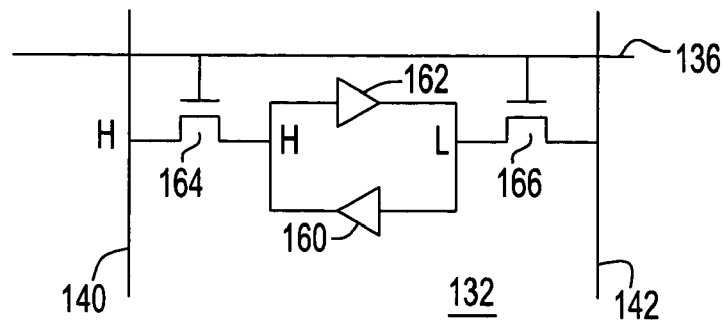
FIG. 3B is a schematic of a single static RAM (SRAM) cell in the RAM.
Figure 3C:
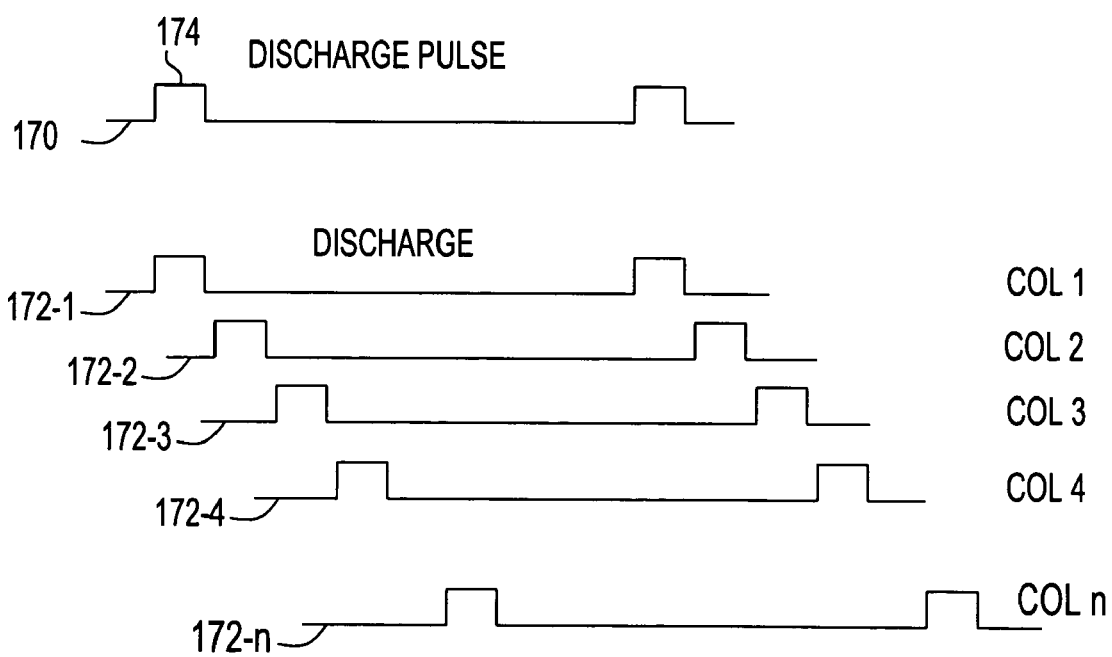
FIG. 3C is an example of a timing diagram of neutralization timing for the RAM.

FIG. 3A shows an example of a random access memory (RAM) 130 with body effect compensation according to a preferred embodiment of the present invention. FIG. 3B is a schematic of a single cell 132 in the RAM 130, a static RAM (SRAM) cell 132 in this example. FIG. 3C is an example of a timing diagram of neutralization timing for the RAM 130. The RAM array 134 is organized in rows or word lines, e.g., 136, and columns 138 of bit line pairs, e.g., 140, 142. In this example, each column is 4 bits wide. Word decode logic 144 selects one of M word lines 136. Bit selection is provided by column select logic 146 to select pass gate pairs 148-0, 148-1, 148-2, 148-3 in one of the columns 138 in any access. Column select logic 146 also includes logic for selecting columns during a neutralization cycle, e.g., a counter for sequentially selecting each of N columns. As with the signal path 100 of FIG. 2A, the RAM 130 includes a body charge monitor circuit 110' and a discharge pulse generator 112 generating a body effect neutralization pulse. A body effect neutralization pulse is generated whenever the RAM 130 remains unaccessed long enough for body effects to have affected cells 132. In addition in this example, the body charge monitor circuit 110' provides a neutralization control signal 150 to a corresponding discharge pair 152-0, 152-1, 152-2, 152-3 for each bit.

As can be seen from FIG. 3B, the SRAM cell 132 is essentially a pair of cross coupled inverters 160, 162, connected between a pair of word line pass gates 164, 166. A one may be stored as the cross coupled inverters 160, 162 set in one state (e.g., 160 providing a high) and a zero in the other (with 162 providing a high). The word line pass gates 164, 166 are connected between the cross coupled inverters 160, 162 and the bit line pair, e.g., 140, 142. The word line 136 turns on and off the pass gate pair 164, 166 to select or de-select the cell 132. At any time, multiple cells 132 in one bit in one column, i.e., between the same bit line pair 140, 142, may be in the same logic state, i.e., all storing all ones or all zeros. On the average, half of the cells 132 on such a bit line pair 140, 142 are hard off and have stabilized. After sufficient time with no access, i.e., with the word line 136 being held low, one pass gate 164 or 166 in each cell 132 is hard off and affected by body effects as described hereinabove. When a cell on the same bit line pair 140, 142 is being written, one side is pulled low and the hard off side of connected cells including the remaining unselected cells, would normally source transient bipolar current, i.e., exhibit body charge effects and slowing cell access. By contrast, body effect charge has been neutralized for the preferred RAM 130, at least in part and, access is unimpeded by body effects.

FIG. 3C is an example of a timing diagram of neutralization timing for a RAM, such as RAM 130 of FIG. 3A. Essentially, during a neutralization cycle, the column select logic 146 sequentially selects array columns 138 through corresponding pass gate pairs 148-0, 148-1, 148-2, 148-3 for neutralization through discharge pairs 152-0, 152-1, 152-2, 152-3, thereby discharging hard off pass gates in cells 130 and limiting switching current in such a discharge. So, as in the example of FIG. 2C, each of the body charge monitor 110', discharge pulse generator 112 and column select logic 146 are clocked by a common clock (not shown), e.g., that may be generated locally. Whenever the data path is idled for a sufficient period of time for body effect charge to have built up in pass gates 164, 166, body charge monitor circuit 110' will provide an indication to that effect. In response, the discharge pulse generator 112 will generate a pulse 170, which passes to column select logic 146. Thereafter, each of the N columns COL1 to COLn are selected by an appropriate pulse 172-1, 172-2, 172-3, 172-4, ..., 172-n to a corresponding column 138. Coincidentally with the first pulse, the neutralization control signal 150 switches on discharge pairs 152-0, 152-1, 152-2 and, 152-3, which provide paths to ground for both bit lines 140, 142 of each pair. The neutralization pulse 174 width is a single cycle long and monitoring and neutralization are interrupted by a normal access. Again, subsequently, when a normal RAM access occurs, the access proceeds normally, unaffected by body effects.

Figure 4:
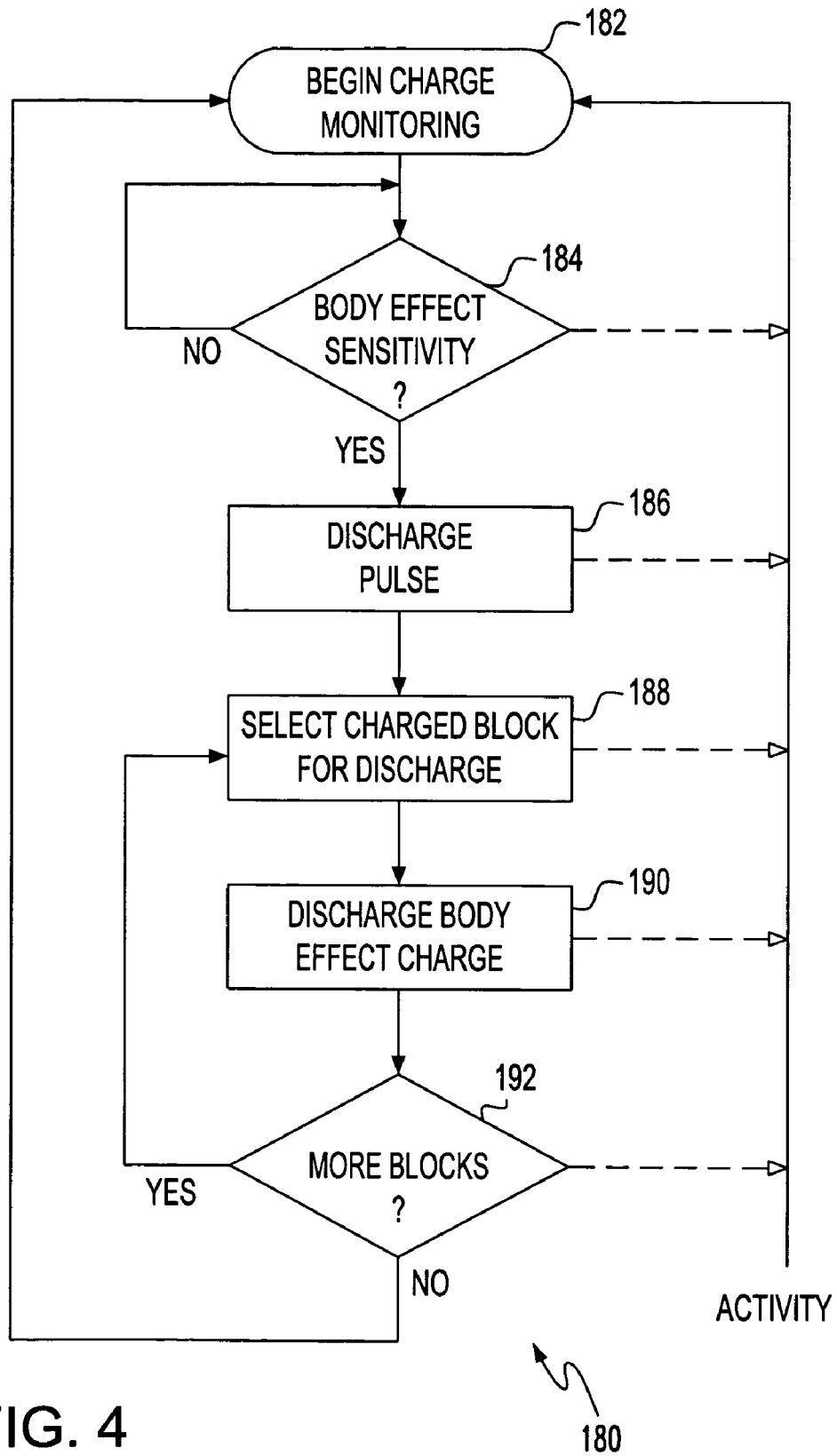
FIG. 4 shows a flow diagram for monitoring and reducing body effect charging according to a preferred embodiment of the present invention.

FIG. 4 shows a flow diagram 180 for monitoring and reducing body effect charging according to a preferred embodiment of the present invention. First, monitoring begins in step 182 after each access for a RAM or circuit activity for logic, when the monitor circuit beings/restarts monitoring circuit activity. In step 184 when enough time has passed the monitoring circuit provides an indication of body effect charging. In response in step 186, the discharge pulse generator provides a neutralization pulse. In step 188, columns are sequentially selected for neutralization or the pulse is passed to logic blocks in the circuit path. In step 190, body effect charge is neutralized in selected columns/blocks. If additional columns/block remain unselected in step 192, then returning to step 188, the next column/block is selected. Otherwise, once all columns/logic blocks have been selected and neutralized in step 192 or at any time the array is accessed or circuit activity occurs, monitoring begins again in step 182.

Advantageously, body effect charge is neutralized in sensitive circuits, reducing sporadic chip failures or soft errors.

While the invention has been described in terms of preferred embodiments, those skilled in the art will recognize that the invention can be practiced with modification within the spirit and scope of the appended claims.

What is claimed is:

1. An integrated circuit (IC) comprising:
    at least one circuit path sensitive to floating body effects;
    a body effect monitor, said body effect monitor monitoring circuit activity for said at least one circuit path and, selectively providing an indication of said body effect charging responsive to monitored circuit inactivity;
    a pulse generator generating a neutralization pulse responsive to an indication of said floating body effects; and
    a neutralization pulse distribution circuit selectively providing said neutralization pulse to blocks in said circuit path.

2. An IC as in claim 1, wherein said circuit path is a logic signal path and said blocks are logic blocks.

3. An IC as in claim 2, wherein said neutralization pulse distribution circuit is a shift register comprising a plurality of shift register latches.

4. An IC as in claim 3, wherein said neutralization pulse is sequentially shifted through said plurality of shift register latches.

5. An IC as in claim 3, said IC further comprising:
    a test circuit, selectively providing test data for testing said blocks; and
    a multiplexor selectively passing data from said test circuit and neutralization pulses from said pulse generator to said shift register.

6. An IC as in claim 1, wherein said circuit path is a random access memory and said blocks are memory cells in a memory array.

7. An IC as in claim 6, wherein said neutralization pulse distribution circuit is a column decode, selecting columns for discharge.

8. An IC as in claim 7, said IC further comprising:
    a column select selecting bit lines in said array; and
    a column discharge circuit, discharging bit lines selected by said column select.

9. An IC as in claim 8, wherein said body effect monitor provides a neutralization control signal to said column discharge circuit, said column discharge circuit discharging selected said bit lines responsive to said neutralization control signal.

10. An integrated circuit (IC) comprising:
    at least one circuit path sensitive to floating body effects, said circuit path including a plurality of logic blocks;
    a body effect monitor, said body effect monitor monitoring circuit activity for said at least one circuit path and, selectively providing an indication of said floating body effects responsive to monitored circuit inactivity;
    a pulse generator generating a neutralization pulse responsive to said indication of body effect charging;
    a test circuit, selectively providing test data for testing said logic blocks;
    a multiplexor selectively passing data from said test circuit and neutralization pulses from said pulse generator; and
    a neutralization pulse distribution circuit receiving selected said test data and said neutralization pulses and passing received said test data and said neutralization pulses to said logic blocks in said circuit path.

11. An IC as in claim 10, wherein said neutralization pulse distribution circuit is a shift register comprising a plurality of shift register latches.

12. An IC as in claim 11, wherein said neutralization pulse is sequentially shifted through said plurality of shift register latches.

13. An IC as in claim 12, wherein said shift register is a test register.

14. A random access memory (RAM) comprising:
    a memory array comprising a plurality of memory cells organized as a plurality of rows and columns;
    a word decoder selecting a word line identifying one of said rows responsive to a memory location access request;
    a column decoder providing a column select signal responsive to said memory location access request;
    a column select selecting a column responsive to said column select signal;
    a pulse generator generating a neutralization pulse responsive to an indication of said floating body effects;
    a neutralization pulse distribution circuit selectively providing said neutralization pulse to said column decoder as said memory location access request; and
    a column select discharge discharging bit lines in a corresponding array column selected by said column select.

15. A RAM as in claim 14, wherein each of said columns includes a plurality of said bit lines.

16. A RAM as in claim 15, wherein said column select is a plurality of pass gate pairs, each of said pass gate pairs connected to one of said plurality of bit lines.

17. A RAM as in claim 15, wherein said column select discharge is a plurality of field effect transistor (FET) pairs, each of said FET pairs connected to a plurality of said pass gate pairs.

18. A RAM as in claim 17, wherein said plurality of memory cells are static RAM (SRAM) cells.

19. A method of maintaining performance in an integrated circuit (IC), said method comprising:
    a) monitoring circuit activity for said at least one circuit path and selectively providing an indication of said floating body effects;
    b) generating a neutralization pulse responsive to an indication of said floating body effects;
    c) selectively providing said neutralization pulse to blocks in said circuit path; and
    d) neutralizing said floating body effects in each selected said block.

20. A method as in claim 19, wherein circuit activity is being monitored for said floating body effects in a logic path and the step (c) of selectively providing said neutralization pulse comprises selecting between test data from a test circuit and said neutralization pulse.

21. A method as in claim 20, wherein the step (c) of selectively providing said neutralization pulse further comprises receiving said neutralization pulse from a prior block neutralization circuit and passing said neutralization pulse to a subsequent block neutralization circuit.

22. A method as in claim 19, wherein circuit activity being monitored for said floating body effects is memory access and the step (c) of selectively providing said neutralization pulse comprises selecting a cell column while holding all memory word lines unselected.

23. A method as in claim 22, wherein the step (c) of selectively providing said neutralization pulse further comprises sequentially selecting each said cell column.

24. A method as in claim 23, wherein the step (c) of selectively providing said neutralization pulse further comprises grounding column lines for each selected said cell column.

25. A method as in claim 22, wherein the step (a) of monitoring circuit activity begins after a memory location access.

26. A method as in claim 25, wherein the step (a) of monitoring circuit activity restarts after each said memory location access.

* * * * *